US012580298B2

(12) United States Patent
Yeap et al.

(10) Patent No.: US 12,580,298 B2
(45) Date of Patent: Mar. 17, 2026

(54) PRINTED CIRCUIT FOR INTEGRATION INTO A SMART CARD, SMART CARD WITH SUCH A PRINTED CIRCUIT AND REEL-TO-REEL TAPE FOR USE IN A FABRICATION PROCESS OF A SMART CARD

(71) Applicant: LINXENS HOLDING, Mantes la Jolie (FR)

(72) Inventors: Yean-Wei Yeap, Singapore (SG); Cindy Ng, Paris (FR)

(73) Assignee: LINXENS HOLDING, Mantes-la-Jolie (FR)

( * ) Notice: Subject to any disclaimer, the term of this patent is extended or adjusted under 35 U.S.C. 154(b) by 15 days.

(21) Appl. No.: 18/580,410

(22) PCT Filed: Sep. 29, 2021

(86) PCT No.: PCT/IB2021/000681
§ 371 (c)(1),
(2) Date: Jan. 18, 2024

(87) PCT Pub. No.: WO2023/052804
PCT Pub. Date: Apr. 6, 2023

(65) Prior Publication Data
US 2025/0079688 A1     Mar. 6, 2025

(51) Int. Cl.
*H01Q 1/22*       (2006.01)
*H01Q 1/38*       (2006.01)
(Continued)

(52) U.S. Cl.
CPC ............. *H01Q 1/2283* (2013.01); *H01Q 1/38* (2013.01); *H05K 1/0243* (2013.01); *H05K 1/111* (2013.01); *H05K 2201/10098* (2013.01)

(58) Field of Classification Search
None
See application file for complete search history.

(56) References Cited

U.S. PATENT DOCUMENTS

| 2015/0269474 A1* | 9/2015 | Finn ....................... B23K 26/40 |
| | | 216/13 |
| 2015/0324683 A1* | 11/2015 | Linfield ................. G06K 19/08 |
| | | 235/492 |
| 2019/0197385 A1* | 6/2019 | Finn ....................... H05K 1/165 |

FOREIGN PATENT DOCUMENTS

| EP | 2 894 716 A1 | 7/2015 |
| JP | 2000 099674 A | 4/2000 |

(Continued)

OTHER PUBLICATIONS

International Search Report and Written Opinion of the International Searching Authority for related International Application No. PCT/IB2021/000681, dated Jun. 7, 2022, 13 pages.

*Primary Examiner* — Crystal L Hammond
(74) *Attorney, Agent, or Firm* — DITTHAVONG, STEINER & MLOTKOWSKI

(57) ABSTRACT

The invention relates in various aspects to a printed circuit for integration into a smart card, a smart card with such a printed circuit and to a reel-to-reel tape for use in a fabrication process of a smart card, wherein the reel-to-reel tape comprises a plurality of such printed circuit. In some illustrative embodiments of an aspect, a printed circuit is provided, the printed circuit comprising a printed circuit support, an antenna wiring pattern of at least one winding continuously extending between a first terminal and a second terminal, and at least one antenna path portion continuously extending between a third terminal and a fourth terminal. Herein, each of the at least one antenna path portion extending between the third and fourth terminal can increase a path length of the antenna wiring pattern if (Continued)

connected to the antenna wiring pattern, adding a path length
of the at least one added antenna path portion to the initial
path length of the antenna wiring pattern.

17 Claims, 3 Drawing Sheets

(51) Int. Cl.
     *H05K 1/02*           (2006.01)
     *H05K 1/11*           (2006.01)

(56)               References Cited

FOREIGN PATENT DOCUMENTS

| | | |
|---|---|---|
| KR | 20070009840 A | 1/2007 |
| WO | 2008051057 A1 | 5/2008 |
| WO | 2015/128188 A2 | 9/2015 |

* cited by examiner

PRINTED CIRCUIT FOR INTEGRATION INTO A SMART CARD, SMART CARD WITH SUCH A PRINTED CIRCUIT AND REEL-TO-REEL TAPE FOR USE IN A FABRICATION PROCESS OF A SMART CARD

RELATED APPLICATION

This U.S. National Phase application claims priority to International Application No. PCT/IB2021/000681, entitled "Printed circuit for integration into a smart card, smart card with such a printed circuit and reel-to-reel tape for use in a fabrication process of a smart card," filed Sep. 29, 2021, the entire contents of which is hereby incorporated by reference.

FIELD OF THE INVENTION

The invention relates to a printed circuit for integration into a smart card, a smart card with such a printed circuit and to a reel-to-reel tape for use in a fabrication process of a smart card, wherein the reel-to-reel tape comprises a plurality of such printed circuits. In particular, the present disclosure relates to a dual interface printed circuit for a dual interface (DIF) smart card.

STATE OF THE ART

Smart cards are increasingly used in the everyday life as payment cards, SIM cards for mobile phones, transport cards, identity cards and the like. There is a strong effort to integrate an increasing number of functions into a smart card for making smart cards more versatile in the application of everyday life.

Typically, a smart card includes transmission means for transmitting data from a chip of the smart card to a card reader device or vice versa. The transmission means can be a contact interface in which a direct electrical contact to an external contact element of the smart card is established and a card reader is able to communicate with the chip of the smart card via a direct electrical contact. Another way of communicating with a chip of the smart card is in a contactless manner by a contactless interface, using an antenna integrated into the smart card, allowing to communicate with the chip of the smart card in a contactless manner.

In a plurality of current card designs, a double interface is provided for not only allowing contactless communication with a chip of a smart card, but also providing an electric contact for directly contacting the chip of the smart card, such as an external contact provided in a card body of a smart card for directly connecting the smart card with a card reader device in a contact manner. Such a double interface transmission means is generally referred to as "dual" in case that a contact mode and a contactless mode are managed by a single chip of the smart card.

Typically, a dual interface (DIF) smart card consists of a rigid plastic support such as PVC, PVC/ABS, PET or polycarbonate, constituting a card body of the smart card into which one or more printed circuits are incorporated. For example, in a common approach, an antenna is integrated into a laminated body (a laminated body prepared at an early stage during fabrication of a smart card, i.e., before integrating electronic chips into the smart card, in the following referred to as a "prelam body"), which is in turn integrated into a card body. One (or more) cavity is milled in the card body to allow the embedding of a smart card module containing a printed circuit and a chip and its connection to the antenna.

The fabrication of such a conventional DIF smart card is very complex because the antenna is usually prepared and integrated at a first factory by means of a so-called antenna inlay, whereas the smart card printed circuit and the integrated modules are manufactured in a second and third factory and a further customization of the prelam body into a card body and the integration of the smart card module into the card takes place at another (fourth) factory. Herein, an inlay is a product integrating an electronic device within a sheet carrier, where single layers with embedded electronics are fused together under pressure and temperature during the lamination process to form one homogeneous and durable sheet carrier. In this regard an antenna inlay is understood as a pattern of an electrical conductive track routed as a pattern forming a circuitry in a sheet carrier to send and receive electromagnetic signals, such as a wire antenna formed of one or more loops of a conductive material (e.g., copper, aluminum or silver).

Furthermore, the embedding of a wire antenna as an inlay into a smart card becomes problematic when considering materials of the smart card other than the materials providing a plastic prelam body. For example, it is very difficult to provide a wire embedding for an antenna inlay in a prelam body formed of wood, ceramic or metal or some other non-plastic material.

BRIEF SUMMARY OF THE DISCLOSURE

The present disclosure solves the above-indicated problems in proposing to integrate contact and contactless features of a smart card into a single module, thereby eliminating the need of a wire antenna inlay separate from contact features providing an external contact of a smart card. It is of a particular advantage in the proposed solution that a single layout of the proposed printed circuit comprising the antenna can be used for a great variety of chips with different capacitance because the proposed layout allows to match a resonance frequency of the contactless features to achieve a desired inductance matching a specific capacitance of a given chip intended for integration into the smart card together with the contactless feature. This solution has the advantage that a greater variety of materials may be used in the fabrication of the card body of a smart card. Moreover, producing one printed circuit which is compatible with a variety of chips leads to a simplification for the tape manufacturer process (for instance, only one set of tools is needed) and the logistics of the producer of the packaged module (for instance, it is necessary to handle only one reference of printed circuit whatever the chip to be used). Finally, this solution is advantageous because it simplifies the card manufacturing process, as no interconnection between module and inlay is needed.

In a first aspect of the present disclosure, a printed circuit for integration into a smart card is provided. In accordance with illustrative embodiments of the first aspect, the printed circuit comprises a printed circuit substrate having two sides (dielectric layer such as epoxy glass tape or FR4, PET, PEN, PI), an antenna wiring pattern of at least one winding located on a first side of the substrate and continuously extending between a first terminal and a second terminal, and at least one antenna path portion continuously extending between a third terminal and a fourth terminal. Herein, each of the at least one antenna path portion extending between the third and fourth terminal increases a path length of the antenna wiring pattern in adding a path length of the at least one added antenna path portion as an additional path length to the path length of the antenna wiring portion, so that an increased antenna wiring pattern having a starting terminal and an ending terminal is formed. In other words, the combination of the antenna wiring pattern and the at least one antenna path portion forms an increased antenna wiring pattern comprising a plurality of windings extending between a starting terminal and an ending terminal. For instance, the starting terminal may be the outer terminal of the antenna and the ending terminal may be the inner terminal of the antenna. However, the starting terminal may also be the inner terminal of the antenna and the ending terminal may also be the outer terminal of the antenna.

Accordingly, the at least one antenna path portion allows to set a desired inductance of the antenna wiring pattern when increasing a path length of the antenna wiring pattern by a path length of the at least one antenna path portion and in particular to match the resulting inductance of the combined antenna wiring pattern and at least one antenna path portion to a capacitance of a chip to be integrated onto the printed circuit to manufacture a smart card module. The resulting printed circuit as suggested in the first aspect allows considering a greater variety of materials in the fabrication of the card body of a smart card.

In accordance with some illustrative embodiments of the first aspect, the antenna wiring pattern and the at least one antenna path portion may be formed without any physical contact. In other words, the at least one antenna path portion is selectively connectable to the antenna wiring pattern when selectively connecting one pad of the antenna wiring pattern to one pad of the at least one antenna path portion, for example using wire-bonding connection or screen printing of conductive ink. Accordingly, the inductance of the antenna wiring pattern may be easily adjusted by selectively adding one or more of the at least one antenna path portion as additional path lengths to the antenna wiring pattern, thereby extending a path length of the antenna wiring pattern when adding one or more antenna path portions to a certain total length of the antenna path portion, thereby resulting in a desired inductance corresponding to the selected total length. Unselected antenna path portions remain unconnected.

Preferably, the antenna wiring pattern and the at least one antenna path portion are manufactured by standard chemical etching processes. Alternatively, the antenna wiring pattern and the at least one antenna path portion are manufactured by conductive ink printing processes.

In accordance with some illustrative embodiments of the first aspect, the antenna wiring pattern and the at least one antenna portion may be formed on the first surface of the printed circuit substrate. Accordingly, the antenna wiring pattern and the at least one antenna path portion may be easily provided on the same side of a very compact printed circuit such that interconnections among the antenna wiring pattern and the antenna path portion may be easily formed.

In accordance with some illustrative examples herein, the printed circuit may further comprise at least one contact pad forming an external contact pattern on a second surface opposite the first surface of the printed circuit substrate. Accordingly, the printed circuit for integration into smart card may represent a dual interface for contact and contactless communication with a smart card.

In accordance with some illustrative embodiments of the first aspect, the at least one antenna path portion may increase a winding number of the antenna wiring pattern by at least one when electrically connecting the one of the first and second terminal with one of the third and fourth terminal. Accordingly, a well-defined adjustment of the inductance of the antenna wiring pattern may be easily achieved via the at least one antenna path portion. To connect the antenna and the antenna path portion, a wire bond connection may be formed between one of the antenna terminal and one of the terminals of the at least one antenna path portion.

In some illustrative examples herein, the wire bond connections between the antenna wiring pattern and the at least one antenna path portion may be protected by an encapsulant.

In some illustrative embodiments of the first aspect, the second to fourth terminals may be completely encircled by the antenna wiring pattern. Accordingly, a compact design of the printed circuit may be easily achieved.

In accordance with some illustrative examples herein, the printed circuit may further comprise a first connection line comprising at least one additional terminal configured to connect the starting terminal of the increased antenna with an IC chip.

This configuration has the advantage that it is flexible and it can be adapted to different IC chips having different capacitance without the need to change the printed circuit design. Preferably, an IC chip is configured to comprise two antenna pads: a first antenna pad is connected to the starting terminal of the antenna and the second antenna pad is connected to the ending terminal of the antenna.

In accordance with some illustrative examples herein, the printed circuit may comprise at least two terminals placed at different positions along the first connection line, each configured to connect the starting terminal of the antenna with the first antenna pad of the IC chip. Depending on the design and on the capacitance of the IC chip, one of the at least two terminals may be employed to connect the starting terminal of the antenna with the first antenna pad of the IC chip, that is the terminal of the first connection line which lies closer to the first antenna pad of the chip. In this way, the printed circuit according to the present invention may be easily adapted to IC chips having different bond pads positions and capacitance.

In accordance with some illustrative examples herein, the printed circuit may further comprise a second connection line comprising at least one auxiliary terminal configured to connect the ending terminal of the increased antenna with an IC chip.

This configuration has the advantage that it is flexible and it can be adapted to different IC chips having different capacitance without the need to change the connection design.

In accordance with some illustrative examples herein, the printed circuit may comprise at least two terminals placed at different positions along the second connection line, each configured to connect the ending terminal of the antenna with the second antenna pad of the IC chip. Depending on the design and on the capacitance of the IC chip, one of the at least two terminals may be employed to connect the ending terminal of the antenna with the second antenna pad of the IC chip, that is the terminal of the second connection line which lies closer to the second antenna pad of the chip. In this way, the printed circuit according to the present invention may be easily adapted to IC chips having different bond pads positions and capacitance.

It is clear for the skilled person that, the first and second connection lines may contribute to the inductance of the antenna-wiring portion in a well-defined manner.

In some illustrative embodiments of the first aspect, an IC chip is attached on a chip landing area on the first side of the printed circuit substrate. In a preferred configuration, wire bonding connections may be formed between the chip and the antenna terminals and between the chip and the contact pads forming an external contact pattern. In other words, the IC chip may have two types of pads: a first type of pads to be connected to the antenna terminal pads and a second type of pads to be connected to the contact pads forming an external contact pattern. In an alternative configuration, the chip may be connected to the antenna by exploiting the flip chip technology.

Preferably, plated or non-plated bonding holes are formed on the printed circuit substrate, so as to allow the electrical connection between the IC chip placed on the first side of the substrate and the contact pads placed on the second side of the substrate.

Accordingly, a DIF module for a smart card comprising a printed circuit, a contact pad and an IC chip is formed. Accordingly, a DIF module for a smart cart of a dual type may be easily provided in a compact form with an adjustable inductance of the antenna wiring pattern.

In some illustrative examples herein, at least one of the two terminals of the IC chip, which is placed on the first side of the substrate, may be connected to one of the at least one contact pads of the external contact pattern, which is placed on the second side of the substrate, by means of a first plated hole. Moreover, the at least one contact pad may be further connected to the starting terminal of the increased antenna, which is placed on the first side, by means of a second plated hole. In this way, the IC chip is connected to the starting terminal of the increased antenna through the external contact pattern. For example, the second plated hole may be placed along the first connection line.

The advantage of this configuration is that long and fragile wire bonding between the chip and the starting terminal of the antenna is avoided, thus saving time and production costs.

In some illustrative examples herein, the IC chip and wires may be protected by an encapsulant. The wire bond connections between the antenna wiring pattern and the addition antenna path portions may also be protected by the encapsulant.

In some illustrative examples herein, the antenna wiring pattern may have a width of at least 9 mm, preferably around 11 mm, or around 17 mm, or around 22 mm.

In some illustrative examples herein, the antenna wiring pattern may have a length shorter than 30 mm to fit into a 35 mm wide tape during reel-to-reel production. For example, the antenna length may be around 26 mm, such as 26.7 mm. However, also lengths of the antenna wiring pattern longer than 30 mm may be produced, for instance when a tape having a width larger than 35 mm (for example 70 mm or more) is employed during reel-to-reel production.

Accordingly, antenna wiring patterns with a greater range of sizes may be employed with respect to prior art. The printed circuit size is limited by the card size and the tape size. For instance, in ID1 cards having an area of 54×85.6 mm, the antenna maximum area is preferably approximately 50×80 mm.

The advantages of producing antenna wiring patterns having relatively small dimensions are that, in this way, the production costs are optimized (the more connectors formed on a reel, the more economical the manufacturing process) and the appearance of the card is improved (the smaller the printed circuit, the bigger the wood or metal surface visible on the card).

In a second aspect, a smart card is provided. In the illustrative embodiments of the second aspect, the smart card comprises a card body and the module comprising the printed circuit of the first aspect. Accordingly, a smart card is not limited by the module with respect to a material of the card body. For example, a card body prepared of a non-plastic material, such as wood, ceramic or metal, may be employed as a card body of the smart card. In case of a card body made of metal, a recess for accommodating the module in the recess may be provided in the card body, the module being isolated against the card body of metal by an electrically insulating lining of the recess and/or by a Radio Frequency shielding material such as ferrite. The smart card may be of dual type.

In a third aspect of the present disclosure, a reel-to-reel tape for using in a fabrication process of a smart card is provided. In the illustrative embodiments of the third aspect, the reel-to-reel tape comprises at least one printed circuit of the first aspect. In other illustrative embodiments of the third aspect, the reel-to-reel tape comprises at least one module comprising the printed circuit of the first aspect with the IC chip. Accordingly, a contact feature and a contactless feature may be provided by means of a single reel-to-reel tape for use in the fabrication process of a smart card.

In some illustrative embodiments of the third aspect, the tape may have a width of about 35 mm. Accordingly a greater number of printed circuits and/or modules may be provided by optimizing the layout of the printed circuits and/or of the modules within a 35 mm tape to be compatible with printed circuit and/or module assembly in reel-to-reel. Accordingly, a printed circuit according to the present invention may be provided which can be designed to be compatible with multiple types of chips, such as chips manufactured by NXP, Infineon and STM (ST Microelectronics) suppliers.

BRIEF DESCRIPTION OF THE DRAWINGS

The present invention will be explained in detail with regard to the accompanying drawings in which.

DETAILED DESCRIPTION

Figure 1:
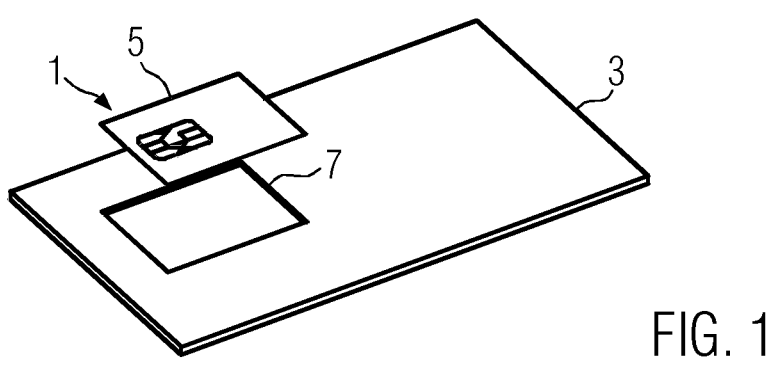
FIG. 1 schematically shows a smart card with dual interface in accordance with some illustrative embodiments of the present disclosure.

FIG. 1 schematically shows, in an exploded perspective view, a smart card 1 comprising a card body 3 and a module 5. The module 5 may comprise a printed circuit (not illustrated) configured to communicate with at least one chip (not illustrated) of the smart card 1 via an external contact (schematically depicted in the module 5 of FIG. 1) and an contactless communication feature, such as an antenna (not illustrated).

In accordance with some illustrative embodiments, the card body 3 of the smart card 1 may be made of any material, e.g. a plastic or non-plastic material, such as a rigid plastic material, a flexible plastic material, and a non-plastic material such as a metal, a ceramic or wood. For example, a plastic material may include at least one of PVC, PVC/ABS, PET, PETG and polycarbonate. In other words, the card body 3 is not limited to a particular material and may be made of any material because the functions of the smart card 1 may be provided by the module 5, which is to be integrated into the card body.

Referring to FIG. 1, an integration of the module 5 into the card body 3 of the smart card 1 may be achieved by forming an opening 7 in the card body 3 (e.g. by milling) such that the module 5 may be accommodated into the opening 7 when integrating the module 5 into the card body 3. The opening 7 may be a recess partially extending into the card body along a thickness direction of the card body 3 or the opening 7 may be a through hole extending through an entire thickness of the card body 3.

Preferably, a recess 7 fitting the module size is milled into the card body 3 and the module is implanted according to standard smart card process. Preferably, it may be necessary to adapt the tooling to the actual size of the module to be implanted. For example, the DIF module 5 according to the present invention may be bigger than the standard ones; hence the tooling must be adapted to the actual size of the module to be implanted.

The module 5 may include one chip (not illustrated) such that the entire functionality of the smart card 1 may be integrated into the module 5. In some exemplary embodiments, the module 5 may include a chip (not illustrated) for implementing a card of a dual type, wherein the chip (not illustrated) is configured to communicate with the external contact and the contactless communication feature (not illustrated).

In accordance with some illustrative embodiments of the present disclosure, the module is not limited to a particular size as long as the size of the module 5 is smaller than geometric dimensions provided by the card body. For example, a size of the module 5 may be only limited by the dimensions of the card body 3 together with optional considerations regarding an aesthetic appearance of the smart card 1.

Figure 2A:
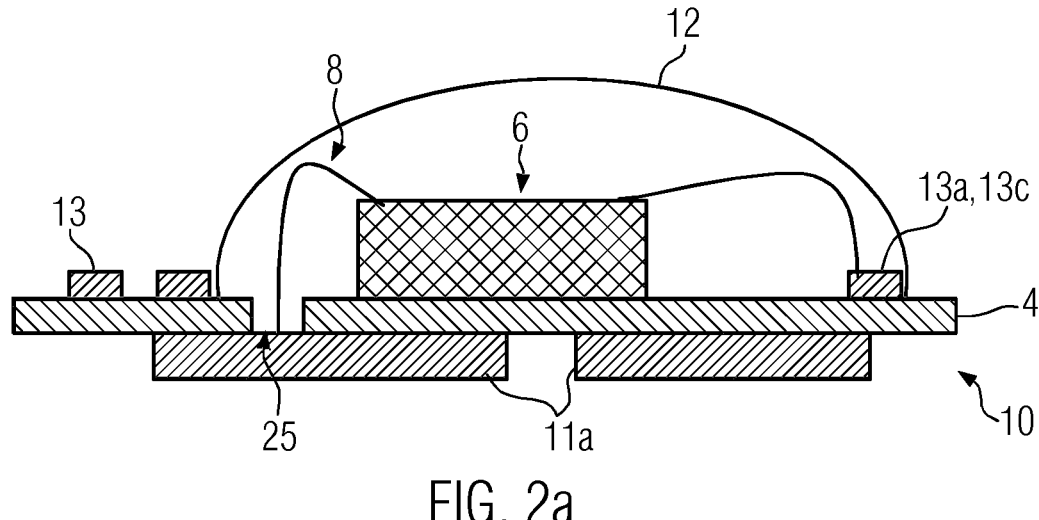
FIG. 2*a* schematically shows a cross sectional view of a dual interface module in a wire bonding configuration with non-plated holes, in accordance with some illustrative embodiments of the present disclosure.
Figure 2B:
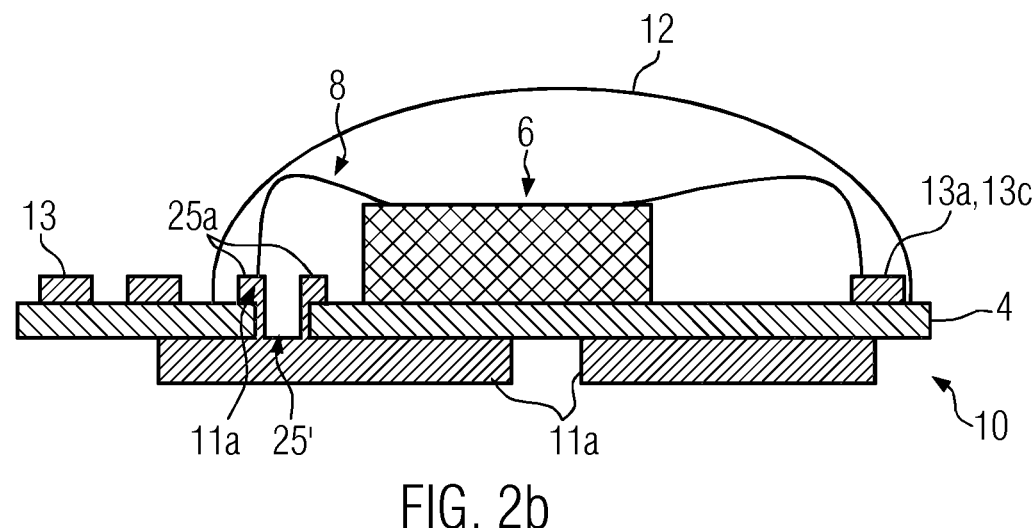
FIG. 2*b* schematically shows a cross sectional view of a dual interface module in a wire bonding configuration with plated holes, in accordance with some illustrative embodiments of the present disclosure.

FIGS. 2a and 2b schematically show a cross sectional view of a dual interface module 10 in accordance with some illustrative embodiments of the present disclosure. In particular, FIG. 2a shows a cross sectional view of a dual interface module 10 in a wire bonding configuration with non-plated holes and FIG. 2b shows a cross sectional view of a dual interface module 10 in a wire bonding configuration with plated holes.

In some illustrative embodiments, the module 10 of FIGS. 2a and 2b may correspond to the module 5 of FIG. 1.

The dual interface module 10 of FIG. 2a comprises a printed circuit substrate 4 having a first side and a second side. On the first side, the IC chip 6 and the antenna pattern 13 are formed, whereas, on the second side, the external contact pads 11a are placed. The IC chip 6 and the bonding wires 8 are protected by an encapsulant material 12.

Holes 25 are formed in the connector substrate 4, allowing wire bonding between the contact pads 11a of the external contact pattern 11 and the chip 6. The holes 25 shown in FIG. 2a are non-plated blind holes for direct connection of a wire 8 with the bottom side of the contact pad 11a.

According to a manufacturing process for producing non-plated blind holes, a substrate layer 4 is provided and at least one sheet of electrically conductive material is provided on its first side. The conductive material may be for example copper, aluminum or an alloy of copper or aluminum. The second side of the substrate layer 4 is coated with an adhesive material (not shown). The substrate layer 4 coated with the adhesive and conductive material is then perforated, for example by mechanical punching or laser, to form holes 25 and possibly side openings (sprocket holes) used for guiding a web in a reel-to-reel process. A second sheet of electrically conductive material is then laminated to the second side of the substrate layer 4. The holes 25 are then so-called "blind" holes as they are closed on one side by the metal foil.

Patterns are then photolithographed on the two sheets of electrically conductive material by deposition, exposure and development of a photosensitive resin. A chemical etching step is used to pattern the electrical circuits on both sides of the substrate (i.e. pads 11a, 13a, 13c in FIG. 2a). The resin protecting the patterns during etching is then chemically removed and additional metal layers (e.g. Nickel, Gold, Palladium) are optionally electrochemically or chemically deposited on the etched patterns and on the bottom of the holes 25.

In preferred configurations, the design of the module 10 may be modified so that the external terminal 13a of the antenna 13 is placed near the IC chip 6, in the encapsulation area. This type of design is for instance disclosed in the patent EP 2877965 B1 from the same applicant, whose content is herein incorporated by reference.

The dual interface module 10 of FIG. 2b corresponds to the dual interface module 10 of FIG. 2a and it differs only for the structure of the holes 25' and the wire bonding configuration. Therefore, the structure of the components (i.e. printed circuit substrate 4, IC chip 6, external contact pattern 11 and antenna pattern 13) of the dual interface module 10 of FIG. 2b is not repeated herein.

The hole 25' shown in FIG. 2b is a plated hole comprising bonding pads 25a electrically connected to the hole 25' and placed next to it. In fact, the plated hole 25' may be too small to allow wire bonding, therefore bonding pads 25a may be added. The chip 6 is then electrically connected to the bonding pads 25a (and thus to the contact pad 11a) for example by wire bonding through wire 8. The plated holes 25' may be either blind holes or through holes, depending on the technical features and on the desired aesthetics.

An example of a manufacturing process for realizing a plated hole circuit is described in details in the patent U.S. Pat. No. 9,799,598 B2 from the same applicant, whose content is herein incorporated by reference.

In particular, the manufacturing process for the production of plated holes 25' differs from the manufacturing process described above for non-plated holes in that plated holes 25' may be either blind holes or through holes. According to the process for the formation of through holes, the substrate layer 4 coated with the adhesive and conductive material is provided with a second layer of conductive material (not illustrated), which is then perforated, for example by mechanical punching or laser, to form holes 25', which are accordingly called "through holes". In the manufacturing process for plated holes, both in the case of plated blind holes and plated through holes, one or more layers of electrically conductive material are then electro-deposited on the walls of the holes 25'.

Figure 3:
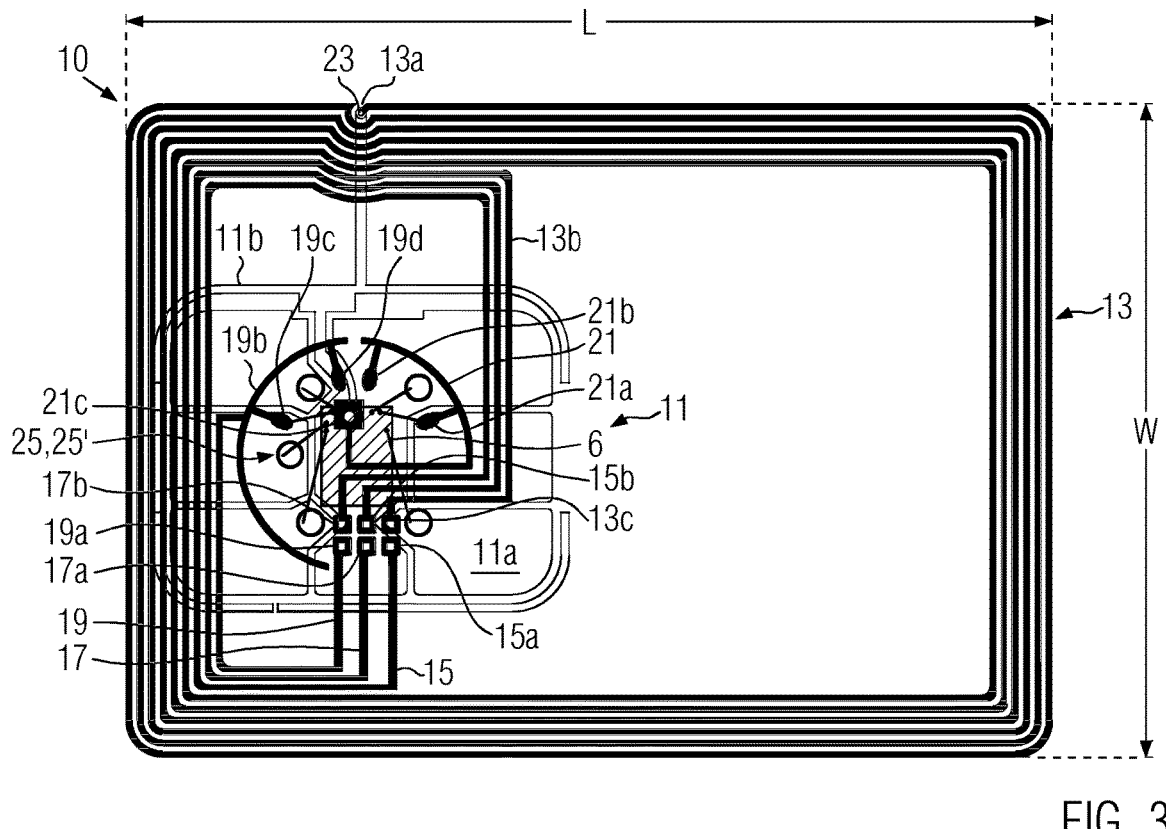
FIG. 3 schematically shows a layout of a module in accordance with some illustrative embodiments of the present disclosure.

Referring to FIG. 3, a top view of a module 10 in accordance with some illustrative embodiments of the present disclosure is schematically shown, wherein the printed circuit substrate 4 is not illustrated for not obscuring the following description of the functions of the module, i.e. the substrate is hidden in the illustration of FIG. 3. In other words, the illustration in FIG. 3 only shows electric features of the module 10, that is, a layout of electric components of the module 10.

The illustration in FIG. 3 is a top view of one side of the module 10 on which an antenna wiring pattern 13 is formed, whereas an external contact pattern 11 is provided on an opposite side of the module 10. The module 10 is thus a double sided module 10, which is manufactured by conventional manufacturing processes known at the state of the art and described in relation with FIGS. 2*a* and 2*b*.

In some illustrative embodiments, the module 10 of FIG. 3 may correspond to the module 5 of FIG. 1. In other words, the view in FIG. 3 could be taken as representing a view of the module 5 in FIG. 1 from below the module 5 illustrated in FIG. 1.

With continued reference to FIG. 3, the external contact pattern 11 is provided with a plurality of contact pads, which are exposed on a side of the module 10, which is arranged in a smart card such that the external contact pattern 11 is exposed in the smart card for directly contacting contacts of a card reader (not illustrated). For example, the external contact pattern 11, may comprise a plurality of contact pads 11*a*, e.g., six contact pads or any number of contacts greater than two. Preferably the contact pad arrangement is designed in accordance with the ISO 7816-2 standard. Holes 25, 25' are provided in the connector substrate 4, allowing wire bonding between the contact pads 11*a* and the chip 6. Holes 25, 25' can be non-plated blind holes or plated holes, as explained above.

In some illustrative examples (not shown), an additional contact pad 11*b* may be placed on the second side of the printed circuit substrate 4 (i.e. on the side comprising external contact pattern 11) for aesthetics purposes. The additional contact pad 11*b* may also be electrically connected to the antenna (located on the first side of the substrate 4), by means of a plated hole 23, and to a second plated hole 21*c* located closer to the chip landing area. As it will be described in details below, the second plated hole 21*c* is also linked to a connection line 21 further comprising terminals 21*a* and 21*b*, which are configured to connect the IC chip 6 to the antenna by means of wire bonding. In this configuration, the starting terminal or outermost terminal of the antenna 13*a* is thus electrically connected to the bonding pads 21*a, b* via the plated holes 23, 21*c* and the contact pad 11*b*. The chip may be wire-bonded to one of the pads 21*a*, 21*b*. This allows the connection of the chip 6 to the external pad 13*a* of the antenna without need to use a long wire, which would be too fragile and expensive.

In accordance with some illustrative embodiments of the present disclosure, the antenna wiring pattern 13 may be provided with at least one winding turn 13*b* continuously extending between terminals 13*a* and 13*c* of the antenna wiring pattern 13. For example, the antenna wiring pattern 13 may be a planar spirally wound coil pattern with an outer terminal corresponding to the terminal 13*a* and an inner terminal provided by terminal 13*c*. For example and as illustrated in FIG. 3, the winding turn 13*b* may represent an innermost winding of the antenna wiring pattern 13, the inner most winding electrically connecting to the terminal 13*c* at one of its ends.

With continued reference to FIG. 3, the module 10 may include at least one antenna path portion (in the illustration of FIG. 3 represented by one of the path portions 15, 17, and 19), which functions to increase a path length of the antenna wiring pattern 13 by a path length of the at least one antenna path portion when connected to the inner antenna terminal. In the illustration of FIG. 3, there are three antenna path portions 15, 17, and 19 provided, whereas this does not limit the scope of the disclosure and one, two or more than three path portions may be formed, instead.

As shown in FIG. 3, the antenna path portions 15, 17, and 19 may represent additional path portions with respect to the antenna wiring pattern 13, which are adapted to allow to continue the spiral coil pattern of the antenna wiring pattern 13 along the inner most winding 13*b*. However, this does not pose any limitation to the present disclosure and the antenna path portions 15, 17, and 19 may be provided as outer most winding portions, which encircle the antenna wiring pattern 13 outside of an outer most winding of the antenna wiring pattern 13 starting at terminal 13*a*. The person skilled in the art will appreciate that each of the antenna path portions 15, 17, and 19 is formed as a distinct wiring track in the surface of the module 10, i.e. without direct physical contact to the antenna wiring pattern 13. In other words, each of the antenna path portions 15, 17, and 19 represents a continuously extending conductor, which continuously extends between two terminals of each path portion.

For example, the antenna path portion 15 is given by a conductive path continuously extending between a terminal 15*a* and a terminal 15*b*. For example, the terminals 15*a* and 15*b* may be located next to each other such that the antenna path portion 15 encircles a portion of a surface of the module 10 located within the antenna wiring portion 13. Accordingly, the antenna path portion 15 may represent a winding turn or at least a part of a turn, which may be added to the antenna wiring pattern such that the antenna wiring pattern 13 may be extended having connecting the terminal 13*c* to the terminal 15*a* for increasing the number of windings by at least one in correspondence with a number of windings implemented by the antenna path portion 15. In this way, a contribution of the antenna path portion 15 to an inductance of the antenna wiring pattern 13 may be well defined.

For example, the antenna path portion 17 is given by a conductive path continuously extending between a terminal 17*a* and a terminal 17*b*. For example, the terminals 17*a* and 17*b* may be located next to each other such that the antenna path portion 17 encircles a portion of a surface of the module 10 located within the antenna wiring portion 13. Accordingly, the antenna path portion 17 may represent a winding turn or at least a part of a turn, which may be added to the antenna wiring pattern such that the antenna wiring pattern 13 may be extended having connecting the terminal 13*c* to the terminal 17*a* for increasing the number of windings by at least one in correspondence with a number of windings implemented by the antenna path portion 17. In this way, a contribution of the antenna path portion 17 to an inductance of the antenna wiring pattern 13 may be well defined.

For example, the antenna path portion 19 is given by a conductive path continuously extending between a terminal 19*a* and a terminal 19*c* or 19*d*. For example, the terminals 19*a*, 19*c* and 19*d* may be located next to each other such that the antenna path portion 19 encircles a portion of a surface of the module 10 located within the antenna wiring portion 13. Accordingly, the antenna path portion 19 may represent a winding turn or at least a part of a turn, which may be added to the antenna wiring pattern such that the antenna wiring pattern 13 may be extended having connecting the terminal 13c to the terminal 19a for increasing the number of windings by at least one in correspondence with a number of windings implemented by the antenna path portion 19. In this way, a contribution of the antenna path portion 19 to an inductance of the antenna wiring pattern 13 may be well defined.

In some illustrative embodiments described below, one or more of the antenna path portions 15, 17 and 19 may be connected in series to the antenna pattern 13 so as to adjust the inductance of the antenna. For instance, a configuration is possible wherein the antenna pattern 13 is connected to the antenna path portion 19. For instance, a configuration is possible wherein the antenna pattern 13 is connected to both the antenna path portions 15 and 19. For instance, a configuration is also possible wherein the antenna pattern 13 is connected to the antenna path portions 15, 17 and 19. In other words, it has to be understood that any combination of the antenna pattern 13 and of the antenna path portions 15, 17 and 19 is possible in order to increase the total length of the antenna of the printed circuit.

In accordance with some illustrative embodiments of the present disclosure, and as illustrated in FIG. 3, the terminals 13c, 15a, 15b, 17a, 17b, 19a, 19c and 19d may be completely encircled by the antenna wiring pattern 13. Accordingly, an advantageous layout of the antenna wiring pattern 13 in the module 10 may be realized where one of the terminals 13c to 19d (representing the innermost terminal or ending terminal of the increased antenna) is connected to the chip 6 of the module 10, which is arranged in the chip landing area within a surface portion of the module 10 encircled by the antenna wiring portion 13.

With continued reference to FIG. 3, the antenna path portion 19 may be connected to a connection line 19b having at least two terminals 19c and 19d for connection to the IC chip 6. In particular, depending on the chip configuration (e.g. chip design and chip capacitance), only one of the at least two terminals 19c or 19d may be used for connecting the antenna to the chip 6. In fact, depending on the chip manufacturer, the position of the chip pads for connection to the antenna and of the chip pads for connection to the external contact varies. Therefore, having different bonding pads 19c, 19d allows to choose the best wire bonding configuration and to avoid crossing wires and potential short circuits. Preferably, the connection line 19b may be formed in the shape of a circular or semi-circular line delimiting the encapsulation area.

In some illustrative examples herein, the connection line 19b may extend in a surface portion of the printed circuit substrate 4 between the antenna wiring pattern 13 and the chip landing area and the connection line 19b may delimit the encapsulation area comprising the chip 6. Accordingly, the connection line 19b may contribute to the inductance of the antenna wiring pattern 13 in a well-defined manner.

It has to be understood that terminals 19c, 19d are employed to connect the antenna to the IC chip 6 only in those configurations wherein the antenna wiring pattern 13 is modified by at least connecting it to the additional antenna path 19. However, in those configurations wherein it is not required to extend the antenna wiring pattern by connecting it to at least one additional antenna path 15, 17, 19, it is also possible to directly connect the chip terminal to the terminal 13c of the antenna wiring pattern 13.

Preferably, the IC chip 6 arranged on the first surface of the printed circuit substrate 4 and the wire bond connections may be protected by an encapsulation resin.

A further connection line 21 may be formed, the connection line 21 representing a circular line partially encircling the chip landing area. For example, the connection lines 19b and 21 may complement a circle which encircles the encapsulation area in the illustration of FIG. 3. The connection line 21 may comprise terminals 21a and 21b which may represent wire bond pads allowing for a wire bonding connection of the antenna wiring pattern 13 and the IC chip 6. In fact, depending on the IC chip configuration, the position of the chip pads for connection to the antenna and of the chip pads for connection to the external contact varies. Accordingly, only one of the terminals 21a or 21b may be connected to the chip 6, that is the terminal allowing the best wire bonding configuration and thus avoiding crossing wires and potential short circuits.

The connection line 21 may further comprise a plated hole 21c. The plated hole 21c is employed to electrically connect the outermost terminal of the antenna 13a to the terminals 21a and 21b and thus to the chip 6. In fact, the antenna terminal 13a may be connected to the external contact pad 11b via the plated hole 23 and the external pad 11b may be connected to the terminals 21a and 21b via the plated hole 21c. The chip 6 may be connected by wire bonding to one of the terminals 21a, 21b. In this way, there is no need to employ long wires between chip 6 and terminal 13a, which would be difficult to handle and would increase the production costs. It is clear for the skilled person that also the connection line 21 may contribute to the inductance of the antenna wiring pattern 13 in a well-defined manner.

In some illustrative examples herein, the antenna wiring pattern 13 may have a width W dimension of at least 9 mm, preferably around 11 mm, or around 17 mm or around 22 mm. Accordingly, antenna wiring patterns with a greater range of widths may be employed.

Figure 4:
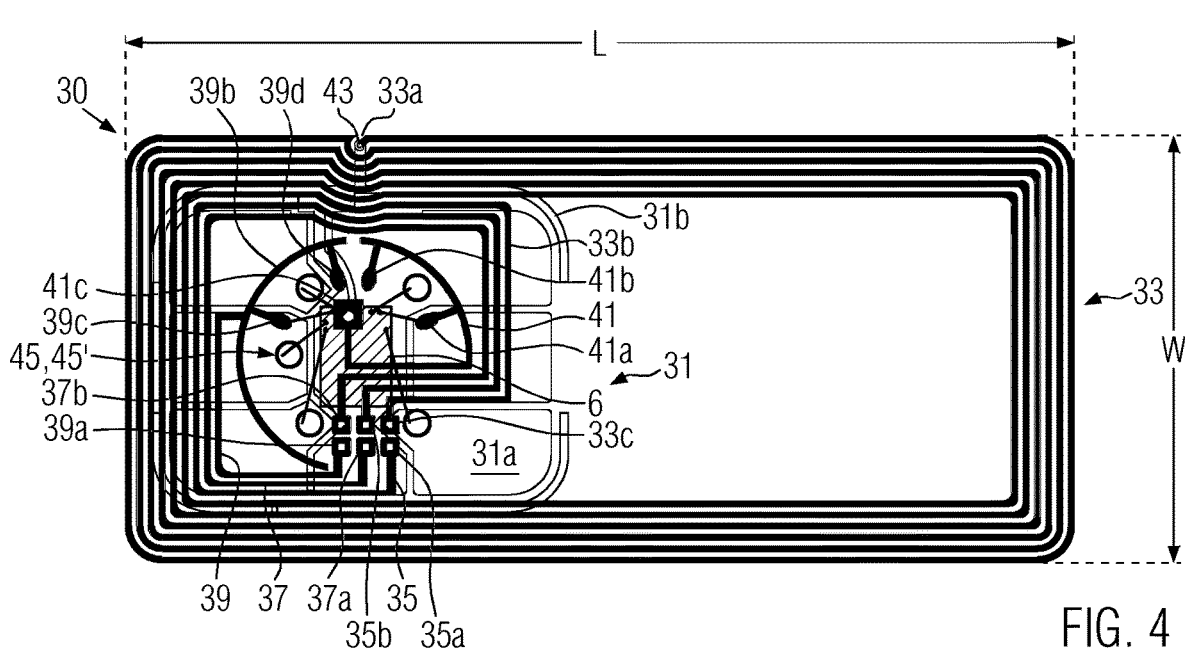
FIG. 4 schematically shows another layout of a module in accordance with some other illustrative embodiments of the present disclosure.

Referring to FIG. 4, a top view of a module 30 in accordance with some illustrative embodiments of the present disclosure is schematically shown, wherein the printed circuit substrate 4 is not illustrated for not obscuring the following description of the functions of the module, i.e. the printed circuit substrate is hidden in the illustration of FIG. 4. In other words, the illustration in FIG. 4 only shows electric features of the module 30, that is, a layout of electric components of the module 30. The illustration in FIG. 4 is a top view of one side of the module 30 on which an antenna wiring pattern 33 is formed, whereas an external contact pattern 31 is provided on an opposite side of the module 30.

In some illustrative embodiments, the module 30 of FIG. 4 may correspond to the module 5 of FIG. 1. In other words, the view in FIG. 4 could be taken as representing a view of the module 5 in FIG. 1 from below the module 5 illustrated in FIG. 1.

With continued reference to FIG. 4, the external contact pattern 31 is provided with a plurality of contact pads, which are exposed on a side of the module 30, which is arranged in a smart card such that the external contact pattern 31 is exposed in the smart card for directly contacting contacts of a card reader (not illustrated). For example, the external contact pattern 31, may comprise a plurality of contact pads 31a, e.g., six contact pads or any number of contacts greater than two. Preferably the contact pad arrangement is designed in accordance with the ISO 7816-2 standard. Holes 45, 45' are provided in the connector substrate 4, allowing wire bonding between the contact pads 31a and the chip 6. Holes 45, 45' can be non-plated blind holes or plated holes, as explained above.

In some illustrative examples (not shown), an additional contact pad 31b may be placed on the second side of the printed circuit substrate 4 (i.e. on the side comprising the external contact pattern 31) for aesthetics purposes. The additional contact pad 11*b* may also be electrically connected to the antenna terminal 33*a* (located on the first side of the substrate 4), by means of a plated hole 43, and to a second plated hole 41*c* located closer to the chip landing area.

The structure and function of the additional contact pad 31*b*, the plated hole 43 and the second plated hole 41*c* of the module 30 illustrated in FIG. 4 correspond to the structure and function of the additional contact pad 11*b*, the plated hole 23 and the second plated hole 21*c* of the module 10 illustrated in FIG. 3 and described in relation thereof; hence, their structure and function will be not described here in detail in order to avoid repetition.

In accordance with some illustrative embodiments of the present disclosure, the antenna wiring pattern 33 may be provided with at least one winding turn 33*b* continuously extending between terminals 33*a* and 33*c* of the antenna wiring pattern 33. For example, the antenna wiring pattern 33 may be a planar spirally wound coil pattern with an outer terminal corresponding to the terminal 33*a* and an inner terminal provided by terminal 33*c*. For example and as illustrated in FIG. 4, the winding turn 33*b* may represent an innermost winding of the antenna wiring pattern 33, the inner most winding electrically connecting to the terminal 33*c* at one of its ends.

As shown in FIG. 4, the antenna wiring pattern 33 may be formed so as to partially overlap the external contact pattern 31 in the illustrated top view. That is, a dimension of the module may be very compact and the antenna wiring pattern 33 may be adapted to a desired size of the module 30. For example, a width of the module 30 may substantially correspond to a width of the external contact pattern 31 (width is understood as matching a dimension along a vertical direction in the illustration of FIG. 4). Optionally, a length dimension (perpendicular to a width dimension) may be relatively long so as to compensate for any loss in an area covered by the antenna wiring pattern 33 when selecting a narrow width. This represents a difference of the embodiments as disclosed with regard to FIG. 4 in comparison with the embodiments described above with respect to FIG. 3, where a corresponding width dimension of the module 10 in FIG. 3 is greater than a width of the external contact pattern 11 in FIG. 3.

With continued reference to FIG. 4, the module 30 may include at least one antenna path portion (in the illustration of FIG. 4 represented by one of the path portions 35, 37, and 39) which functions to increase a path length of the antenna wiring pattern 33 by a path length of the at least one antenna path portion when connected to the inner antenna terminal. In the illustration of FIG. 4, there are three antenna path portions 35, 37, and 39 provided, whereas this does not limit the scope of the disclosure and one, two or more than three path portions may be formed, instead.

As shown in FIG. 4, the antenna path portions 35, 37, and 39 may represent additional path portions with respect to the antenna wiring pattern 33, which are adapted to allow to continue the spiral coil pattern of the antenna wiring pattern 33 along the inner most winding 33*b*. However, this does not pose any limitation to the present disclosure and the antenna path portions 35, 37, and 39 may be provided as outer most winding portions, which encircle the antenna wiring pattern 33 outside of an outer most winding of the antenna wiring pattern 33 starting at terminal 33*a*. The person skilled in the art will appreciate that each of the antenna path portions 35, 37, and 39 is formed as a distinct wiring track in the surface of the module 30, i.e. without direct physical contact to the antenna wiring pattern 33. In other words, each of the antenna path portions 35, 37, and 39 represents a continuously extending conductor, which continuously extends between two terminals of each path portion.

For example, the antenna path portion 35 is given by a conductive path continuously extending between a terminal 35*a* and a terminal 35*b*. For example, the terminals 35*a* and 35*b* may be located next to each other such that the antenna path portion 35 encircles a portion of a surface of the module 30 located within the antenna wiring portion 33. Accordingly, the antenna path portion 35 may represent a winding turn or at least a part of a turn, which may be added to the antenna wiring pattern such that the antenna wiring pattern 33 may be extended having connecting the terminal 33*c* to the terminal 35*a* for increasing the number of windings by at least one in correspondence with a number of windings implemented by the antenna path portion 35. In this way, a contribution of the antenna path portion 35 to an inductance of the antenna wiring pattern 33 may be well defined.

For example, the antenna path portion 37 is given by a conductive path continuously extending between a terminal 37*a* and a terminal 37*b*. For example, the terminals 37*a* and 37*b* may be located next to each other such that the antenna path portion 37 encircles a portion of a surface of the module 30 located within the antenna wiring portion 33. Accordingly, the antenna path portion 37 may represent a winding turn or at least a part of a turn, which may be added to the antenna wiring pattern such that the antenna wiring pattern 33 may be extended having connecting the terminal 33*c* to the terminal 37*a* for increasing the number of windings by at least one in correspondence with a number of windings implemented by the antenna path portion 37. In this way, a contribution of the antenna path portion 37 to an inductance of the antenna wiring pattern 33 may be well defined.

For example, the antenna path portion 39 is given by a conductive path continuously extending between a terminal 39*a* and one of terminals 39*c* and 39*d*. For example, the terminals 39*a*, 39*c* and 39*d* may be located next to each other such that the antenna path portion 39 encircles a portion of a surface of the module 30 located within the antenna wiring portion 33. Accordingly, the antenna path portion 39 may represent a winding turn or at least a part of a turn, which may be added to the antenna wiring pattern such that the antenna wiring pattern 33 may be extended having connecting the terminal 33*c* to the terminal 39*a* for increasing the number of windings by at least one in correspondence with a number of windings implemented by the antenna path portion 39. In this way, a contribution of the antenna path portion 39 to an inductance of the antenna wiring pattern 33 may be well defined.

It has to be understood that, also for the module 30 of the configuration of FIG. 4, any combination of the antenna wiring pattern 33 with any of the antenna path portions 35, 37 and 39 may be employed to extend the length of the antenna wiring pattern 33 and to adapt its inductance to a desired value.

In accordance with some illustrative embodiments of the present disclosure, and as illustrated in FIG. 4, the terminals 33*c*, 35*a*, 35*b*, 37*a*, 37*b*, 39*a*, 39*c* and 39*d* may be completely encircled by the antenna wiring pattern 33. Accordingly, an advantageous layout of the antenna wiring pattern 33 in the module 30 may be realized where one of the terminals 33*c* to 39*d* is arranged so as to get into contact with the chip 6 of the module 30 which is arranged in the chip landing area within a surface portion of the module 30 encircled by the antenna wiring portion 33.

With continued reference to FIG. 4, the antenna path portion 39 may be connected to a connection line 39*b* having at least two terminals 39c and 39d for connection to the IC chip 6. In particular, depending on the chip configuration, one of the at least two terminals 39c or 39d may be used for connecting the antenna to the chip 6. In fact, depending on the chip manufacturer, the position of the chip pads for connection to the antenna and of the chip pads for connection to the external contact varies. Therefore, having different bonding pads 39c, 39d allows to choose the best wire bonding configuration and to avoid crossing wires and potential short circuits. Preferably, the connection line 39b may be formed in the shape of a circular or semi-circular line delimiting the encapsulation area.

In some illustrative examples herein, the connection line 39b may extend in a surface portion of the printed circuit substrate 4 between the antenna wiring pattern 13 and the chip landing area and the connection line 39b may delimit the encapsulation area comprising the chip 6. Accordingly, the connection line 39b may contribute to the inductance of the antenna wiring pattern 13 in a well-defined manner.

It has to be understood that terminals 39c, 39d are employed to connect the antenna to the IC chip 6 only in those configurations wherein the antenna wiring pattern 33 is modified by at least connecting it to the additional antenna path 39. However, in those configurations wherein it is not required to extend the antenna wiring pattern by connecting it to at least one additional antenna path 35, 37, 39, it is also possible to directly connect the IC chip 6 to the terminal 33c of the antenna wiring pattern 33.

As illustrated in FIG. 4, the module 30 may further comprise one or more bonding holes 45 implementing vertical interconnections which extend along a thickness direction of the module 30 (in the illustration of FIG. 4, the holes represent interconnection elements that substantially extend along a normal direction of the illustrated paper plane). The holes 45 may be plated or non-plated holes and may correspond to the holes 25, 25' described with reference to FIGS. 2a, 2b and 3.

In some illustrative examples herein, the antenna wiring pattern 33 may have a width dimension W of at least 9 mm, preferably around 11 mm, or around 17 mm, or around 22 mm. Accordingly, antenna wiring patterns with a greater range of widths may be employed.

With regard to FIGS. 5 to 7, different layouts of a module will be discussed. In particular, FIGS. 5 to 7 show an enlarged view of a portion of a module 10 at the chip landing area for receiving the chip 6.

Figures 5, 6, 7:
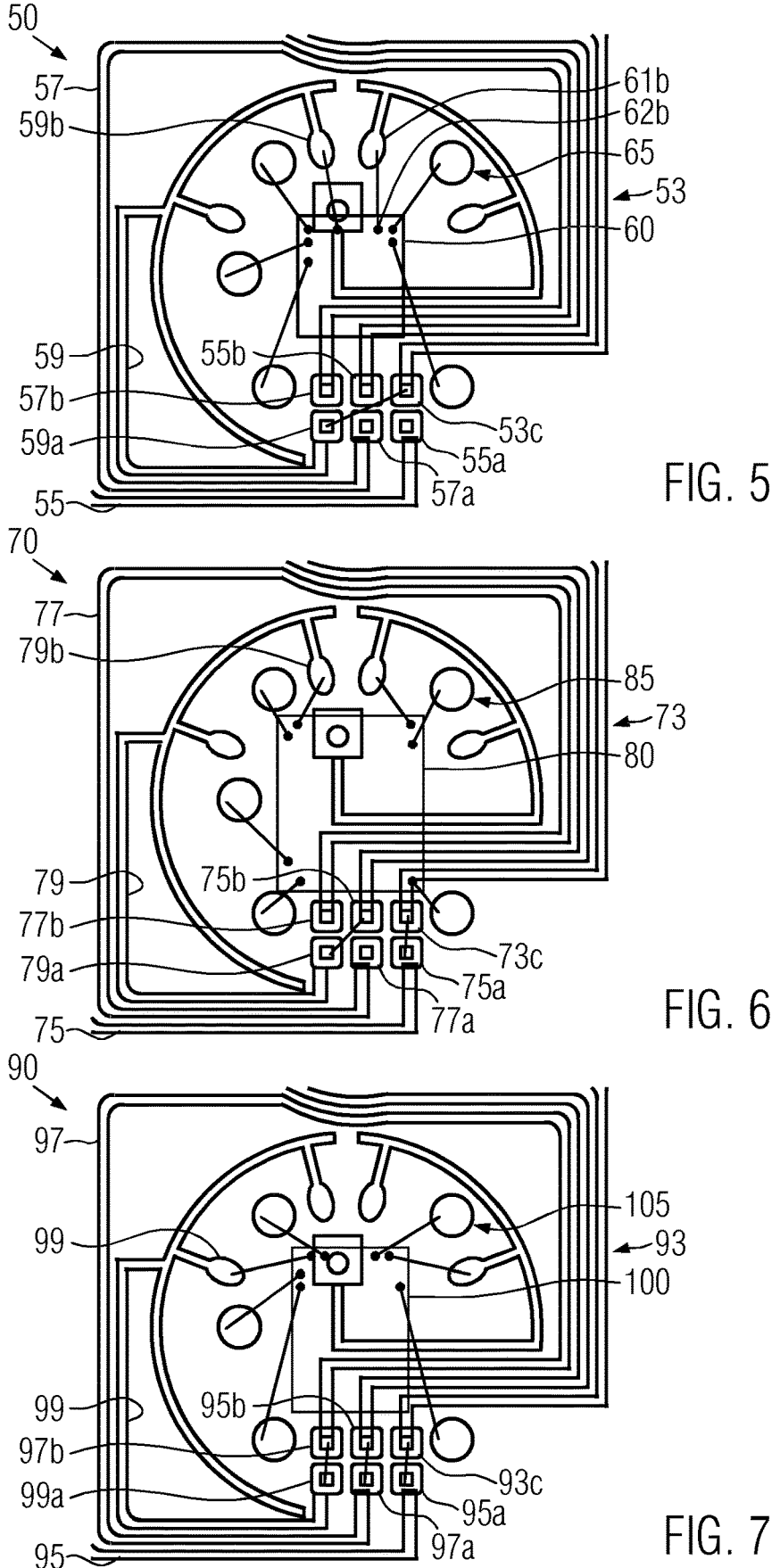
FIGS. 5 to 7 schematically show different configurations of modules for interconnecting an antenna wiring pattern with different types of chips in enlarged views of a portion of a module.

FIG. 5 schematically shows a layout 50 of a module, e.g. one of the modules 10 and 30 as described above with regard to FIGS. 3 and 4, wherein the view in FIG. 5 shows an enlarged portion at and around the chip landing area where the chip 60 is mounted onto the module. The layout 50 comprises an antenna wiring pattern 53 similar to at least one of the antenna wiring patterns 13 and 33 as described above. The enlarged portion of the antenna wiring pattern 53 shows a portion of an inner most winding of the antenna wiring pattern ending at a terminal pad 53c which is similar to terminal pad 13c or 33c as described above with regard to FIGS. 3 and 4. The layout 50 further comprises at least one antenna path portion in the form of the antenna path portions 55, 57, and 59. Each of the antenna path portions 55, 57 and 59 may correspond to least one of the antenna path portions 15, 17, 19 and 35, 37, and 39 as described above with regard to FIGS. 2 and 3. That is, the antenna path portion 55 extends continuously between a terminal 55a and a terminal 55b. Similarly, the antenna path portion 59 extends between a terminal 59a and a wire bond pad arrangement including wire bond pad 59b. The antenna path portion 59 may correspond to at least one of the antenna path portions 19 and 39 as described above with regard to FIGS. 2 and 3, in particular similarly including one or more wire bond pads and connection lines as described above.

With continued reference to FIG. 5, the layout 50 further comprises one or more holes 65 similar to the holes 25, 25', 45 and 45' as described above with regard to FIGS. 3 and 4. The holes 65 may serve as wire bond holes for accommodating the wire which connects the chip 60, on one side, to the external pattern (not illustrated), on the other side. Alternatively, in the case of plated holes 65, a wire bond pad may be located next to the hole 65 and connected to it, in order to establish an electric connection with the wire connected to the IC chip 60 and the external pattern (not illustrated). Additionally, the wire bond pads of the antenna wiring pattern may be connected to the antenna pads of the chip 60: for instance, the antenna pad 62b of the chip 60 may be connected either to the pad of the outermost antenna terminal 53a (not represented in FIG. 5) or to the pad 61b which is electrically connected to the antenna terminal 53a.

The person skilled in the art will appreciate that the layout 50 is designed compatible with multiple types of chips, such as supplied by NXP, Infineon and STM suppliers. An adjustment of the inductance of the antenna wiring pattern 53 may be adapted by properly connecting at least two of the terminals 53a to 59a. For example, FIG. 5 shows an electrically interconnection between the terminal 53c and 59a, thereby connecting the inner most winding of the antenna wiring pattern 53 with the antenna path portion 59. The interconnection between the terminals 53c and 59a may be achieved via wire bonding as indicated by an according wire bond connection. According to the configuration shown in FIG. 5, since the antenna wiring pattern 53 is connected to the antenna path portion 59, the resulting inductance of the antenna is adapted to match with a capacitance of the chip 60 for setting a desired resonance frequency of the contactless function of the module.

In accordance with some special illustrative example, the chip 60 may be for example of the chip type supplied by Infineon with a capacitance of 78 pF.

FIG. 6 schematically shows a layout 70 of a module, e.g. one of the modules 10 and 30 as described above with regard to FIGS. 3 and 4, wherein the view in FIG. 6 shows an enlarged portion at and around a chip landing area where the chip 80 is mounted to the module. The layout 70 comprises an antenna wiring pattern 73 similar to at least one of the antenna wiring patterns 13 and 33 as described above. The enlarged portion of the antenna wiring pattern 73 shows a portion of an inner most winding of the antenna wiring pattern ending at a terminal pad 73c which is similar to terminal pad 13c or 33c. The layout 70 further comprises at least one antenna path portion in the form of the antenna path portions 75, 77, and 79. Each of the antenna path portions 75, 77 and 79 may correspond to least one of the antenna path portions 15, 17, 19 and 35, 37, and 39 as described above with regard to FIGS. 2 and 3. That is, the antenna path portion 75 extends continuously between a terminal 75a and a terminal 75b. Similarly, the antenna path portion 79 extends between a terminal 79a and a wire bond pad arrangement including wire bond pad 79b. The antenna path portion 79 may correspond to at least one of the antenna path portions 19 and 39 as described above with regard to FIGS. 3 and 4, in particular similarly including one or more wire bond pads and connection lines as described above.

With continued reference to FIG. 6, the layout 70 further comprises one or more holes 85 similar to the holes 25, 25', 45 and 45' as described above with regard to FIGS. 3 and 4.

The person skilled in the art will appreciate that the layout 70 is designed compatible with multiple types of chips, such as supplied by NXP, Infineon and STM. An adjustment of the inductance of the antenna wiring pattern may be adapted by properly connecting at least two of the terminals 73*a* to 79*a*. For example, FIG. 6 shows an electrically interconnection between the terminal 73*c* and 75*a* and the terminal 75*b* and 79*a*, thereby connecting the inner most winding of the antenna wiring pattern 73 with the antenna path portions 75 and 79. The interconnection between the terminals 73*c* and 75*a* and the terminal 75*b* and 79*a* may be achieved via wire bonding as indicated by an according wire bond connection. Accordingly, the antenna wiring pattern 73 is connected to the antenna path portions 75 and 79 and the resulting inductance is adapted to match with a capacitance of the chip 80 for setting a desired resonance frequency of the contactless function of the module.

In accordance with some special illustrative example, the chip 80 may be for example of the chip type supplied by STM with a capacitance of 68 pF.

FIG. 7 schematically shows a layout 90 of a module, e.g. one of the modules 10 and 30 as described above with regard to FIGS. 3 and 4, wherein the view in FIG. 7 shows an enlarged portion at and around a chip landing area where the chip 100 is mounted to the module. The layout 90 comprises an antenna wiring pattern 93 similar to at least one of the antenna wiring patterns 13 and 33 as described above. The enlarged portion of the antenna wiring pattern 93 shows a portion of an inner most winding of the antenna wiring pattern ending at a terminal pad 93*c* which is similar to terminal pad 13*c* and 33*c* as described above with regard to FIGS. 3 and 4. The layout 90 further comprises at least one antenna path portion in the form of the antenna path portions 95, 97, and 99. Each of the antenna path portions 95, 97 and 99 may correspond to least one of the antenna path portions 15, 17, 19 and 35, 37, and 39 as described above with regard to FIGS. 3 and 4. That is, the antenna path portion 95 extends continuously between a terminal 95*a* and a terminal 95*b*. Similarly, the antenna path portion 99 extends between a terminal 99*a* and a wire bond pad arrangement including wire bond pad 99*b*. The antenna path portion 99 may correspond to at least one of the antenna path portions 19 and 39 as described above with regard to FIGS. 3 and 4, in particular similarly including one or more wire bond pads and connection lines as described above.

With continued reference to FIG. 7, the layout 90 further comprises one or more holes 105 similar to the holes 25, 25', 45 and 45' as described above with regard to FIGS. 3 and 4.

The person skilled in the art will appreciate that the layout 90 is designed compatible with multiple types of chips, such as supplied by NXP, Infineon and STM suppliers. An adjustment of the inductance of the antenna wiring pattern may be adapted by properly connecting at least two of the terminals 93*a* to 99*a*. For example, FIG. 7 shows an electrically interconnection between the terminals 93*c* and 95*a*, between the terminals 95*b* and 97*a*, and between the terminals 97*b* and 99*a*, thereby connecting the inner most winding of the antenna wiring pattern 93 with the antenna path portion 99. The interconnection between the terminals 93*c* and 95*a*, between the terminals 95*b* and 97*a*, and between the terminals 97*b* and 99*a* may be achieved via wire bonding as indicated by an according wire bond connection. Accordingly, the antenna wiring pattern 93 is connected to the antenna path portions 95, 97, 99 and the resulting inductance is adapted to match with a capacitance of the chip 100 for setting a desired resonance frequency of the contactless function of the module.

In accordance with some special illustrative example, the chip 100 may be for example of the chip type supplied by NXP with a capacitance of 56 pF.

Accordingly, the embodiments of FIGS. 5 to 7 show that, independent of a particular chip type and an according pattern of wire bond pads on the chip, terminal adjacent the chip landing area in a module layout allow a wire bonding connection between the antenna wiring pattern and connection line pattern and the chip.

In summary, an integration of contact and contactless features of a smart card into a module is proposed, thus eliminating the need of an embedding of a wire antenna into a card body. Accordingly, a resonance frequency may be matched by connecting antenna path portions with an antenna wiring pattern to increase path lengths of an antenna wiring pattern for matching the inductance of the antenna wiring pattern to a desired value. This allows the printed circuit to be compatible with multiple chips with only one design. The advantage of producing one single printed circuit which is compatible with a variety of chips leads are the simplification for the tape manufacturer process (only one set of tools is needed) and the simplification of the module producer logistics (only one reference needs to be handled).

Accordingly, different materials may be selected, not limited to a particular type of plastic material as commonly used for smart cards. Furthermore, it is possible to employ a module according to the present disclosure in a single layer card body having a thickness in the range from 0.5 to 1.0 mm, e.g., at about 0.76 mm as it is for example known for standard ID1 cards. In manufacturing a smart card, a card body of a smart card is provided, e.g. as a prelam body, by laminating different layers together, or by forming a card body from a single piece of material, forming an opening in the card body at a location where the antenna of the contactless feature is to be placed, and integrating a module with the antenna into the opening. Accordingly, an antenna and chip device as a smart card, where antenna and chip are integrated in the same substrate as a single entity is provided.

In accordance with some illustrative embodiments of the present disclosure, a reel-to-reel tape may be used in the fabrication process of a smart card, the reel-to-reel tape comprising at least one module as described above with regard to FIGS. 2 to 6. In some illustrative examples herein, the tape of the reel-to-reel tape may have a width of about 35 mm and a module having width of more than 9 mm, preferably around 14 mm, may be arranged in an optimum way in the tape.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

LIST OF REFERENCES

1 Smart card
3 Card body
4 Substrate
5 Module
6, 60, 80, 100 IC chip
7 Opening
8 Wire
10, 30, 50, 70, 90 Module
11, 31 External contact pattern
11a, 11b, 31a, 31b Contact pads
12 Encapsulant
13, 33, 53, 73, 93 Antenna wiring pattern
13a, 33a Starting antenna terminal
13c, 33c, 53c, 73c, 93c Ending antenna terminal
13b, 33b Winding turn
15, 35, 55, 75, 95 Additional path portions
17, 37, 57, 77, 97 Additional path portions
19, 39, 59, 79, 99 Additional path portions
15a, 15b, 35a, 35b, 55a, 55b, 75a, 75b, 95a, 95b Terminals of the additional path portions
17a, 17b, 37a, 37b, 57a, 57b, 77a, 77b, 97a, 97b Terminals of the additional path portions
19a, 19c, 19d, 39a, 39c, 39d, 59a, 59b, 79a, 79b, 99a, 99b Terminals of the additional path portions
19b, 39b Connection line
21, 41 Connection line
21a, 21b, 41a, 41b Terminals
21c, 41c Plated hole
23, 43 Plated hole
25, 45 Non-plated hole
25' Plated hole
25a Bonding pad
62b Chip antenna pad
65, 85, 105 Holes

The invention claimed is:

1. Printed circuit for integration into a smart card, comprising:
a printed circuit substrate having two sides;
an antenna wiring pattern of at least one winding located on a first side of the printed circuit substrate and continuously extending between a first terminal and a second terminal; and
at least one antenna path portion continuously extending between a third terminal and a fourth terminal;
wherein the at least one antenna path portion is configured to increase a path length of the antenna wiring pattern by a path length of the at least one antenna path portion, so that an increased antenna wiring pattern having a starting terminal and an ending terminal is formed if the at least one antenna path portion is connected to the antenna wiring pattern; and
a first connection line comprising at least one additional terminal configured to connect the starting terminal of the increased antenna with an IC chip.

2. Printed circuit of claim 1, wherein the antenna wiring pattern and the at least one antenna path portion are formed without any physical contact.

3. Printed circuit of claim 1, wherein the antenna wiring pattern and the at least one antenna portion are formed on the first surface of the printed circuit substrate.

4. Printed circuit of claim 3, further comprising at least one contact pad forming an external contact pattern on the second surface opposite the first surface.

5. Printed circuit of claim 1, wherein the at least one antenna path portion increases a winding number of the antenna wiring pattern by at least one when electrically connecting one of the first and second terminal with one of the third and fourth terminal.

6. Printed circuit of claim 5, wherein the electrical connection is made by wire bonding one of the first and second terminal with one of the third and fourth terminal.

7. Printed circuit of claim 1, wherein the second to fourth terminals are completely encircled by the antenna wiring pattern.

8. Printed circuit of claim 1, further comprising a second connection line comprising at least one auxiliary terminal configured to connect the ending terminal of the increased antenna with an IC chip.

9. Printed circuit of claim 1, wherein the antenna wiring pattern has a width of at least 9 mm, for example 11 mm, or 17 mm, or 22 mm, and/or a length shorter than 30 mm.

10. Module comprising:
a printed circuit comprising:
a printed circuit substrate having two sides;
an antenna wiring pattern of at least one winding located on a first side of the printed circuit substrate and continuously extending between a first terminal and a second terminal; and
at least one antenna path portion continuously extending between a third terminal and a fourth terminal;
wherein the at least one antenna path portion is configured to increase a path length of the antenna wiring pattern by a path length of the at least one antenna path portion, so that an increased antenna wiring pattern having a starting terminal and an ending terminal is formed if the at least one antenna path portion is connected to the antenna wiring pattern; and
an IC chip attached on a chip landing area, wherein the IC chip is located on the first side of the printed circuit substrate and comprises at least two antenna pads electrically connected to the starting and ending terminals of the increased antenna by means of wire bonding, wherein the printed circuit further comprises:

a first connection line comprising at least one additional terminal configured to connect the starting terminal of the increased antenna with the IC chip.

11. Module of claim 10 when comprising a printed circuit according to claim 4, wherein at least one of the two antenna pads of the IC chip, which is placed on the first side, is connected to the at least one contact pad, which is placed on the second side, by means of a plated hole, and the at least one contact pad is further connected to the starting terminal of the increased antenna, placed on the first side, by means of a second plated hole, so that the IC chip is connected to the starting terminal of the increased antenna through the external contact pattern.

12. Module of claim 10, wherein the IC chip and the at least one bond wire are encapsulated by an encapsulant.

13. Smart card, comprising:

(1) a card body and the printed circuit comprising:

a printed circuit substrate having two sides;

an antenna wiring pattern of at least one winding located on a first side of the printed circuit substrate and continuously extending between a first terminal and a second terminal; and at least one antenna path portion continuously extending between a third terminal and a fourth terminal;

wherein the at least one antenna path portion is configured to increase a path length of the antenna wiring pattern by a path length of the at least one antenna path portion, so that an increased antenna wiring pattern having a starting terminal and an ending terminal is formed if the at least one antenna path portion is connected to the antenna wiring pattern;

(2) a module comprising:

the printed circuit;

the antenna wiring pattern;

the at least one antenna path portion; and an IC chip attached on a chip landing area, wherein the IC chip is located on the first side of the printed circuit substrate and comprises at least two antenna pads electrically connected to the starting and ending terminals of the increased antenna by means of wire bonding, wherein the printed circuit further comprises:

a first connection line comprising at least one additional terminal configured to connect the starting terminal of the increased antenna with the IC chip.

14. Smart card according to claim 13, wherein the card body is made of a non-plastic material such as wood, metal or ceramic.

15. Reel-to-reel tape for use in a fabrication process of a smart card, the reel-to-reel tape comprising at least one printed circuit comprising:

a printed circuit substrate having two sides;

an antenna wiring pattern of at least one winding located on a first side of the printed circuit substrate and continuously extending between a first terminal and a second terminal; and at least one antenna path portion continuously extending between a third terminal and a fourth terminal;

wherein the at least one antenna path portion is configured to increase a path length of the antenna wiring pattern by a path length of the at least one antenna path portion, so that an increased antenna wiring pattern having a starting terminal and an ending terminal is formed if the at least one antenna path portion is connected to the antenna wiring pattern, wherein the printed circuit further comprises:

a first connection line comprising at least one additional terminal configured to connect the starting terminal of the increased antenna with an IC chip.

16. Reel-to-reel tape of claim 15, wherein the tape has a width of 35 mm.

17. Reel-to-reel tape for use in a fabrication process of a smart card, the reel-to-reel tape comprising at least one module comprising:

a printed circuit comprising:

a printed circuit substrate having two sides;

an antenna wiring pattern of at least one winding located on a first side of the printed circuit substrate and continuously extending between a first terminal and a second terminal; and at least one antenna path portion continuously extending between a third terminal and a fourth terminal;

wherein the at least one antenna path portion is configured to increase a path length of the antenna wiring pattern by a path length of the at least one antenna path portion, so that an increased antenna wiring pattern having a starting terminal and an ending terminal is formed if the at least one antenna path portion is connected to the antenna wiring pattern; and an IC chip attached on a chip landing area, wherein the IC chip is located on the first side of the printed circuit substrate and comprises at least two antenna pads electrically connected to the starting and ending terminals of the increased antenna by means of wire bonding, wherein the printed circuit further comprises:

a first connection line comprising at least one additional terminal configured to connect the starting terminal of the increased antenna with the IC chip.

* * * * *